United States Patent
Kim et al.

(10) Patent No.: US 9,857,614 B2
(45) Date of Patent: Jan. 2, 2018

(54) DISPLAY APPARATUS

(71) Applicant: Samsung Display Co., Ltd., Yongin, Gyeonggi-Do (KR)

(72) Inventors: Yong-Hwi Kim, Asan-si (KR); Seongsik Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 486 days.

(21) Appl. No.: 14/293,244

(22) Filed: Jun. 2, 2014

(65) Prior Publication Data
US 2015/0163896 A1    Jun. 11, 2015

(30) Foreign Application Priority Data
Dec. 11, 2013  (KR) .................. 10-2013-0153983

(51) Int. Cl.
*H05K 5/02* (2006.01)
*G02F 1/1333* (2006.01)
*H04N 5/64* (2006.01)

(52) U.S. Cl.
CPC ......... *G02F 1/133308* (2013.01); *H04N 5/64* (2013.01); *H05K 5/02* (2013.01); *H05K 5/0239* (2013.01); *G02F 2001/133314* (2013.01)

(58) Field of Classification Search
None
See application file for complete search history.

(56) References Cited

U.S. PATENT DOCUMENTS

| | | | |
|---|---|---|---|
| 9,113,553 B2 * | 8/2015 | An | H05K 5/0217 |
| 9,202,395 B2 * | 12/2015 | Cho | G09F 9/35 |
| 2007/0146569 A1 | 6/2007 | Nouchi et al. | |
| 2009/0316062 A1 | 12/2009 | Nishizawa | |
| 2012/0281367 A1 | 11/2012 | He et al. | |
| 2013/0169520 A1 * | 7/2013 | Cho | G06F 3/0488 345/156 |
| 2013/0329162 A1 * | 12/2013 | Fujii | H05K 7/14 349/58 |
| 2014/0101560 A1 * | 4/2014 | Kwak | G06F 1/1652 715/738 |

FOREIGN PATENT DOCUMENTS

| | | | |
|---|---|---|---|
| JP | 2013257385 A | * | 12/2013 |
| KR | 20-0319900 Y1 | | 7/2003 |
| KR | 1020080018728 A | | 2/2008 |
| KR | 20130004657 U | * | 7/2013 |
| KR | 20-0469887 Y1 | | 11/2013 |

* cited by examiner

*Primary Examiner* — Courtney Smith
*Assistant Examiner* — Jessey R Ervin
(74) *Attorney, Agent, or Firm* — Cantor Colburn LLP

(57) ABSTRACT

A display apparatus includes a curved display panel displaying an image, a bottom frame which is disposed below the curved display panel and curved along the curved display panel, and the bottom frame having an opening which is defined in the bottom frame with the display panel in a plan view, and a cover member covering the opening.

18 Claims, 5 Drawing Sheets

DISPLAY APPARATUS

This application claims priority to Korean Patent Application No. 10-2013-0153983, filed on Dec. 11, 2013, and all the benefits accruing therefrom under 35 U.S.C. §119, the entire contents of which are hereby incorporated by reference.

BACKGROUND

1. Field

Exemplary embodiments of the invention relate to a display apparatus, and in particular, to a curved display apparatus.

2. Description of the Related Art

A flat-panel display apparatus, such as a liquid crystal display ("LCD") apparatus and an organic electroluminescence display apparatus, is used as an image-displaying device in various information-processing systems including a television, a computer monitor, a laptop computer, and a mobile phone.

Recently, a curved display apparatus is being developed as a next generation display apparatus. The curved display apparatus makes it possible to provide a curved display area for a user, and this allows the user to perceive an image with improved cubic effect increasing a sense of immersion.

SUMMARY

Exemplary embodiments of the invention provide a lightweight display apparatus including a curved surface.

According to exemplary embodiments of the invention, a display apparatus may include a curved display panel which displays an image and a bottom cover curved along the curved the display panel.

In exemplary embodiments, the display panel may include a rectangular plate having at least two pairs of parallel sides. In an exemplary embodiment, the rectangular display panel may include long sides extending along a first direction and short sides extending along a second direction crossing the first direction, and may be curved along one of the first and second directions.

In exemplary embodiments, the bottom cover may include a bottom frame provided along an edge of the display panel, a supporting frame connected to the bottom frame, and a cover member covering an opening defined by the bottom and supporting frames.

In exemplary embodiments, the bottom frame may include first to fourth frame portions. The first and second frame portions may extend parallel to the first direction and spaced apart from each other in the second direction. In an exemplary embodiment, the first and second frame portions may be provided along the long sides of the display panel, respectively. The third and fourth frame portions may extend parallel to the second direction and spaced apart from each other in the first direction. In an exemplary embodiment, the third and fourth frame portions may be provided along the short sides of the display panel, respectively. The first to fourth frame portions may include a lightweight material, e.g., an aluminum-containing metal, and each of the first to fourth frame portions may have a curved shape.

In exemplary embodiments, each of the first to fourth frame portions may have at least one bending portion, when viewed in a cross sectional view perpendicular to the extending direction thereof, and have a polygonal shape or a polygonal ring shape.

In exemplary embodiments, the supporting frame may have a curved shape and connect at least two of the first to fourth frame portions to each other. The supporting frame may be provided in a plural number and the supporting frames may be connected to the bottom frame to define a plurality of openings.

In exemplary embodiments, the supporting frame may be provided between the first frame and the second frame to extend parallel to the first direction and connected to the third frame and the fourth frame. Further, the supporting frame may be provided between the third frame and the fourth frame to extend parallel to the second direction and connected to the first frame and the second frame.

In exemplary embodiments, the supporting frame may include a lightweight material, e.g., an aluminum-containing metal and have a curved shape.

In exemplary embodiments, the cover member may cover the opening defined by the bottom frame or openings defined by the bottom frame and the supporting frame. The cover member may include a curved aluminum plate covering wholly the opening. Here, the shape of the cover member may be changed depending on the shape of the bottom frame.

In exemplary embodiments, the cover member is provided in a plural number, each of which is provided in a corresponding one of the plurality of openings. Here, the shape of the cover members may be changed depending on the shape of the corresponding opening.

Further, in exemplary embodiments, a recess in which the bottom frame or the supporting frame is inserted may be defined in the cover members. The recess may be defined along a circumference side of each of the cover members. The cover member may include a flexible material, e.g., silicone resin.

BRIEF DESCRIPTION OF THE DRAWINGS

Exemplary embodiments, advantages and features of this disclosure will be more clearly understood from the following brief description taken in conjunction with the accompanying drawings. The accompanying drawings represent non-limiting, exemplary embodiments as described herein.

DETAILED DESCRIPTION

Figure 1:
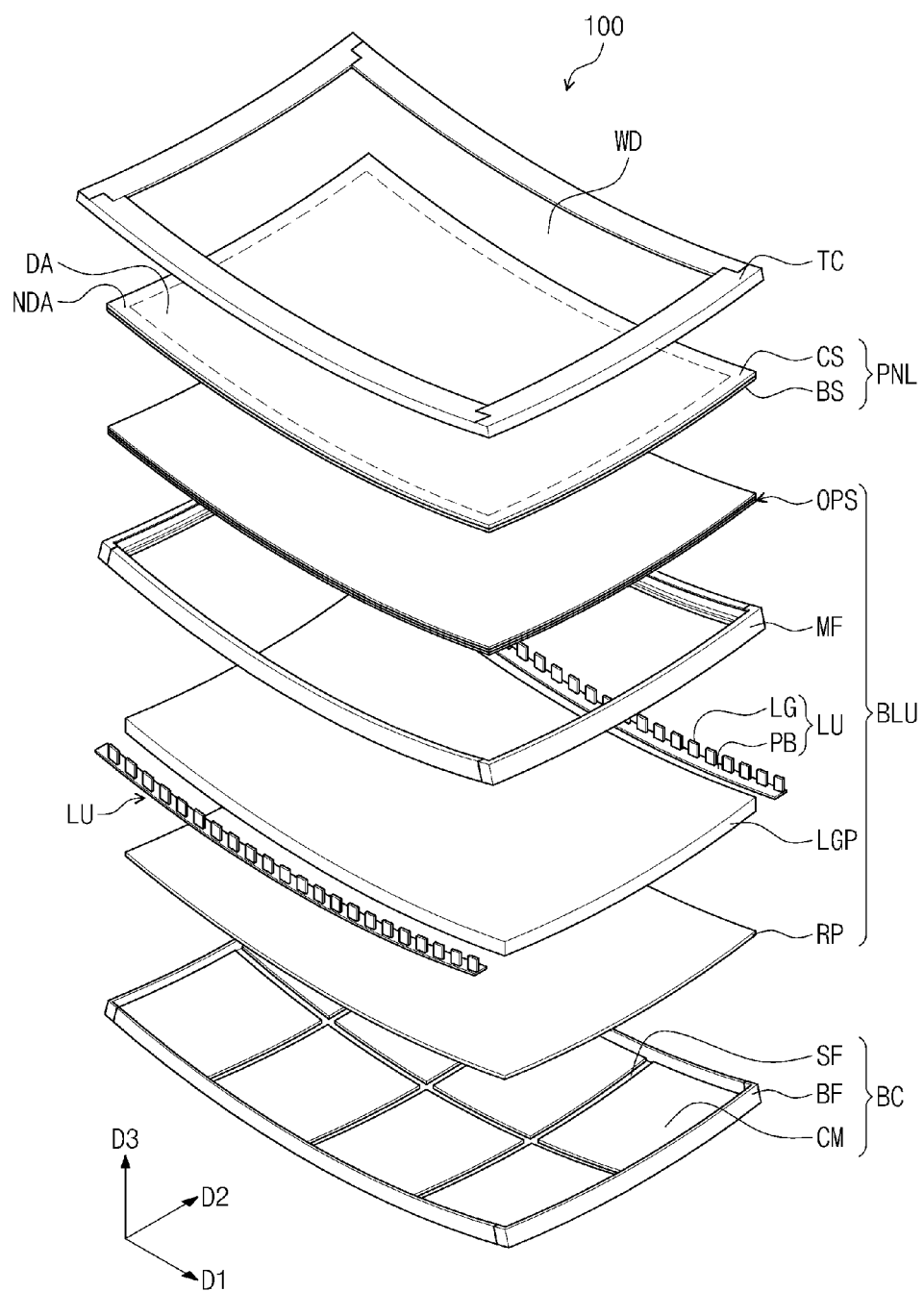
FIG. 1 is an exploded perspective view of exemplary embodiments of a display apparatus according to the invention.

Exemplary embodiments of the invention will now be described more fully with reference to the accompanying drawings, in which exemplary embodiments are shown. Exemplary embodiments of the invention may, however, be embodied in many different forms and should not be construed as being limited to the embodiments set forth herein; rather, these embodiments are provided so that this disclosure will be thorough and complete, and will fully convey the exemplary embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion, e.g., "between" versus "directly between," "adjacent" versus "directly adjacent," "on" versus "directly on".

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In an exemplary embodiment, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Drawings are intended to illustrate general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by exemplary embodiments. In an exemplary embodiment, the relative thicknesses and positioning of molecules, layers, regions and/or structural elements may be reduced or exaggerated for clarity. The use of similar or identical reference numbers in the various drawings is intended to indicate the presence of a similar or identical element or feature.

Unless otherwise defined, all terms (including technical and scientific terms) used herein have the same meaning as commonly understood by one of ordinary skill in the art to which exemplary embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an exploded perspective view of a display apparatus according to exemplary embodiments of the invention.

Referring to FIG. 1, a display apparatus 100 may have a curved shape. In an exemplary embodiment, the display apparatus 100 may have a curved shape in both of a first direction D1 and a second direction D2 crossing the first direction D1. In exemplary embodiments, the first direction D1 and the second direction D2 are perpendicular to each other.

The invention may not be limited to the illustrated exemplary embodiments, in which the display apparatus 100 has the curved shape in both of the first and second directions D1 and D2. In another exemplary embodiment, the display apparatus 100 may have a curved shape in one of the first and second directions D1 and D2. Further, in another exemplary embodiment, the first and second directions D1 and D2 may not be parallel and perpendicular to each other.

The display apparatus 100 may include a display panel PNL, a backlight unit BLU, a top chassis TC, and a bottom cover BC. Here, for convenience in description, a propagation direction of light or image emitted from the display apparatus 100 will be referred to as an "upward direction" and a direction opposite to the upper direction will be referred to as a "downward direction." Nevertheless, the upward and downward directions may be relative concepts, and in other exemplary embodiments, the upward direction and the downward direction may be changed to indicate other directions.

The display panel PNL may be configured to display images. In an exemplary embodiment, the display panel PNL may include one of passive-type display panels, e.g., a liquid crystal display panel ("LCD"), an electrowetting display panel, an electrophoretic display panel, a microelectromechanical system ("MEMS") display panel, and so forth.

However, exemplary embodiments of the invention may not be limited a specific type of the display panel PNL. In an exemplary embodiment, the display panel PNL may include an organic electroluminescence display panel or a plasma display panel, for example. In the cases of the organic electroluminescence display panel and the plasma display panel, the display apparatus 100 may not include the backlight unit BLU, because the organic electroluminescence display panel and the plasma display panel are self-luminous display panels.

Hereinafter, for convenience in description, the description that follows will refer to an example of the illustrated exemplary embodiment in which the display panel PNL is the LCD.

In an exemplary embodiment, the display panel PNL may have a rectangular shape having two pairs of opposite sides, where one of the two pairs may be longer than the other. Hereinafter, the display panel PNL will be described with reference to a rectangle having a pair of long sides parallel to the first direction D1 and a pair of short sides parallel to the second direction D2.

In an exemplary embodiment, the display panel PNL may be configured to have flexibility. In other words, the display apparatus 100 may be initially provided to have a flat or curved shape, and when a fabrication or assembly process is finished, the display apparatus 100 may have a different shape from an initial shape thereof. The display panel PNL may be curved or bent in various manners. In an exemplary embodiment, the display panel PNL may be convexly bent in the downward or upward direction, but the bending direction of the display panel PNL will not be limited thereto. In exemplary embodiments, the display panel PNL may be bent in such a way that the display panel PNL has a convex central portion in the upward direction toward a user. In an alternative exemplary embodiment, a portion of the display panel PNL may be bent toward the upward direction, while another portion thereof may be bent toward the downward direction.

The display panel PNL may be initially provided without flexibility to have a curved shape. In an exemplary embodiment, the display panel PNL may be initially provided to have a fixed curved shape and have a convex shape in the downward or upward direction, a convex central portion protruding in the upward direction toward a user, or two portions protruding toward the upward and downward directions, respectively.

For the sake of simplicity, the description that follows will refer to an example of the illustrated exemplary embodiment in which the display panel PNL is curved in both of the extending directions of the long and short sides, i.e., the first and second directions D1 and D2. In the illustrated exemplary embodiment, the display panel PNL has a specific curvature in the downward direction, when viewed in sectional views taken along the first and second directions D1 and D2. Here, the curvature of the display panel PNL may be given by a curvature radius measured along a direction, e.g., the first or second direction D1 or D2. In other embodiments, the display panel PNL may have a curved shape in one of the first direction D1 and the second direction D2. In still other embodiments, the display panel PNL may have a curved shape in a different direction from the first and second directions D1 and D2.

In exemplary embodiments, when a user is located at a specific position spaced apart from the display panel PNL, a distance between the user and an edge portion of the display panel PNL may be substantially the same as a distance between the user and a central portion of the display panel PNL, and this allows the user to see images without any image distortion.

The display panel PNL may include a display area DA for displaying images and a non-display area NDA provided in at least one of edge regions around the display area DA.

The display panel PNL may include a base substrate BS, a counter substrate CS facing the base substrate BS, and a liquid crystal layer (not shown) interposed between the base and counter substrates BS and CS. An edge portion of the display panel PNL may be covered by the top chassis TC. In exemplary embodiments, the base substrate BS may include a plurality of pixel electrodes (not shown) and a plurality of thin-film transistors ("TFTs") (not shown) electrically connected to the pixel electrodes, respectively. Each of the TFTs may be configured to control an operation of providing a driving signal to a corresponding one of the pixel electrodes.

The counter substrate CS may include a common electrode (not shown), which may be used to produce electric field for controlling an orientation of liquid crystal molecules, in conjunction with the pixel electrodes. Images displayed by the display panel PNL may be adjusted by controlling the liquid crystal layer.

The backlight unit BLU may be provided below the display panel PNL to supply light to the display panel PNL. The backlight unit BLU may include a plurality of light source units LU providing light toward the display panel PNL, a light-guiding part LGP, a reflection part RP, and optical sheets OPS. In exemplary embodiments, the backlight unit BLU may further include a mold frame MF supporting the display panel PNL and the optical sheets OPS.

Each of the light source units LU may be configured to emit light. In exemplary embodiments, each of the light source units LU may include a printed circuit board ("PCB") PB and a plurality of light-emitting diode ("LED") packages LG mounted on the PCB PB to generate the light.

The light source units LU may be arranged along a curved surface of the display panel PNL. As show in FIG. 1, a pair of the light source units LU may be curvedly arranged along the long sides of the display panel PNL, respectively, and spaced apart from each other in the second direction D2, but the invention may not be limited thereto. In another exemplary embodiment, a pair of the light source units LU may be curvedly arranged along the short sides of the display panel PNL, respectively, and spaced apart from each other in the first direction D1. In other embodiments, one light source unit LU may be curvedly arranged along one of the long and short sides of the display panel PNL.

As shown in FIG. 1, the light source units LU may be provided adjacent to the light-guiding part LGP, and in this case, lights emitted from a plurality of the LED packages LG may be incident into the light-guiding part LGP.

The light-guiding part LGP may be disposed in the bottom cover BC and configured to guide light emitted from the light source units LU toward the display panel PNL.

The reflection part RP may be disposed in the bottom cover BC and between the light-guiding part LGP and the bottom cover BC. In an exemplary embodiment, the reflection part RP may contain a reflective material, e.g., polyethylene terephthalate ("PET") or aluminum ("Al"), for example.

The optical sheets OPS may be provided between the light source unit LU and the display panel PNL. The optical sheets OPS may control the light emitted from the light source units LU. In an exemplary embodiment, the optical sheets OPS may include a diffusion sheet, a prism sheet, and a protection sheet stacked on the light-guiding part LGP.

The diffusion sheet may be configured to diffuse the light. The prism sheet may be configured to focus the light diffused by the diffusion sheet on the display panel PNL thereon in a direction perpendicular thereto. In an exemplary embodiment, light passing through the prism sheet may be perpendicularly incident into the display panel PNL. The protection sheet may be disposed on the prism sheet to protect the prism sheet against an external impact. In exemplary embodiments, the optical sheets OPS may include one diffusion sheet, one prism sheet, and one protection sheet, but exemplary embodiments of the invention may not be limited thereto. In an exemplary embodiment, in the optical sheets OPS, at least one of the diffusion, prism, and protection sheets may have a multi-layered structure, and when necessary, at least one of the diffusion, prism, and protection sheets may be omitted. Further, a stacking order of the diffusion, prism, and protection sheets may be changed.

The mold frame MF may be provided below the display panel PNL to support the display panel PNL. In an exemplary embodiment, the mold frame MF may support an edge of the display panel PNL. In exemplary embodiments, the mold frame MF may be configured to support the optical sheets OPS disposed below the display panel PNL.

The mold frame MF may include a fixing member, e.g., a fastening portion (not shown), which may be configured to fasten or support the display panel PNL, the optical sheets OPS, or other parts, e.g., a portion of the light source units LU. The mold frame MF may be provided at a position(s) corresponding to at least one of the four sides of the display panel PNL. In an exemplary embodiment, the mold frame MF may have a rectangular ring shape to support all of the four sides of the display panel PNL. In an alternative exemplary embodiment, the mold frame MF may be shaped like a letter 'U' to support three sides of the display panel PNL. The mold frame MF may include a single body or an assembly including a plurality of parts. The mold frame MF may include an organic material, e.g., polymer resin, but the invention may not be limited thereto. In other exemplary embodiments, when necessary, various other materials can be used for the mold frame MF.

In other exemplary embodiments, the backlight unit BLU may be configured in a manner differing from the afore-described exemplary embodiments. In other exemplary embodiments, the backlight unit BLU may not include the light-guiding part LGP, and in this case, a plurality of the LED packages LG may be provided between the display panel PNL and the reflection part RP. In an exemplary embodiment, when viewed in a plan view, the LED packages LG may be overlapped with the display area DA of the display panel PNL. In detail, according to the exemplary embodiments shown in FIG. 1, the LED packages LG may be provided at an edge of a back surface of the display panel PNL to constitute an edge-type backlight unit. However, in other embodiments, the LED packages LG may be arranged directly below the back surface of the display panel PNL to constitute a direct-type backlight unit. The LED packages LG may be uniformly or regularly arranged and spaced apart from each other. In exemplary embodiments, a diffusing part may be further provided between the LED packages LG and the display panel PNL to diffuse light emitted from the LED packages LG.

The bottom cover BC may be configured to include at least one or all of components constituting the backlight unit BLU. In an exemplary embodiment, the bottom cover BC may have a curved shape. In an exemplary embodiment, the bottom cover BC may be configured to have substantially the same curvature as that of the display panel PNL.

The bottom cover BC may include a bottom frame BF, a supporting frame SF, and a cover member CM.

The bottom frame BF may face an edge of the display panel PNL. In exemplary embodiments, the bottom frame BF may include a fixing member, e.g., a fastening portion FP to be described with reference to FIG. 3, which may be configured to fasten or support a portion of the backlight unit BLU. The bottom frame BF may be provided at a position(s) corresponding to at least one of the four sides of the display panel PNL. In an exemplary embodiment, the bottom frame BF may have a rectangular ring shape, and thus, it can support all of the four sides of the display panel PNL. Accordingly, when viewed in a plan view, an opening OP may be defined in the bottom frame BF, and may be overlapped with the display panel PNL. The opening OP will be described in more detail with reference to FIG. 2.

The supporting frame SF may be provided in the opening OP of the bottom frame BF and connected to the bottom frame BF. The supporting frame SF may support some of the parts of the backlight unit BLU included in the bottom cover BC. Further, the supporting frame SF may be configured to prevent the bottom cover BC from being deformed.

The cover member CM may cover the opening OP of the bottom frame BF and thereby to prevent a foreign body from being provided into the display apparatus 100.

The top chassis TC may be provided on the display panel PNL. The top chassis TC may support an edge portion of a top surface of the display panel PNL and cover a side surface of the mold frame MF or the bottom cover BC. The top chassis TC may define a window WD exposing the display area DA of the display panel PNL.

In exemplary embodiments, each part of the display apparatus 100, e.g., the display panel PNL, the light-guiding part LGP, the reflection part RP, and the optical sheets OPS, may have a predetermined curvature. In an exemplary embodiment, each or all of the light-guiding part LGP, the reflection part RP, and the optical sheets OPS may be curved to have substantially the same curvature as that of the display panel PNL. Further, the mold frame MF and the top chassis TC may also be curved to have substantially the same curvature as that of the display panel PNL.

Figure 2:
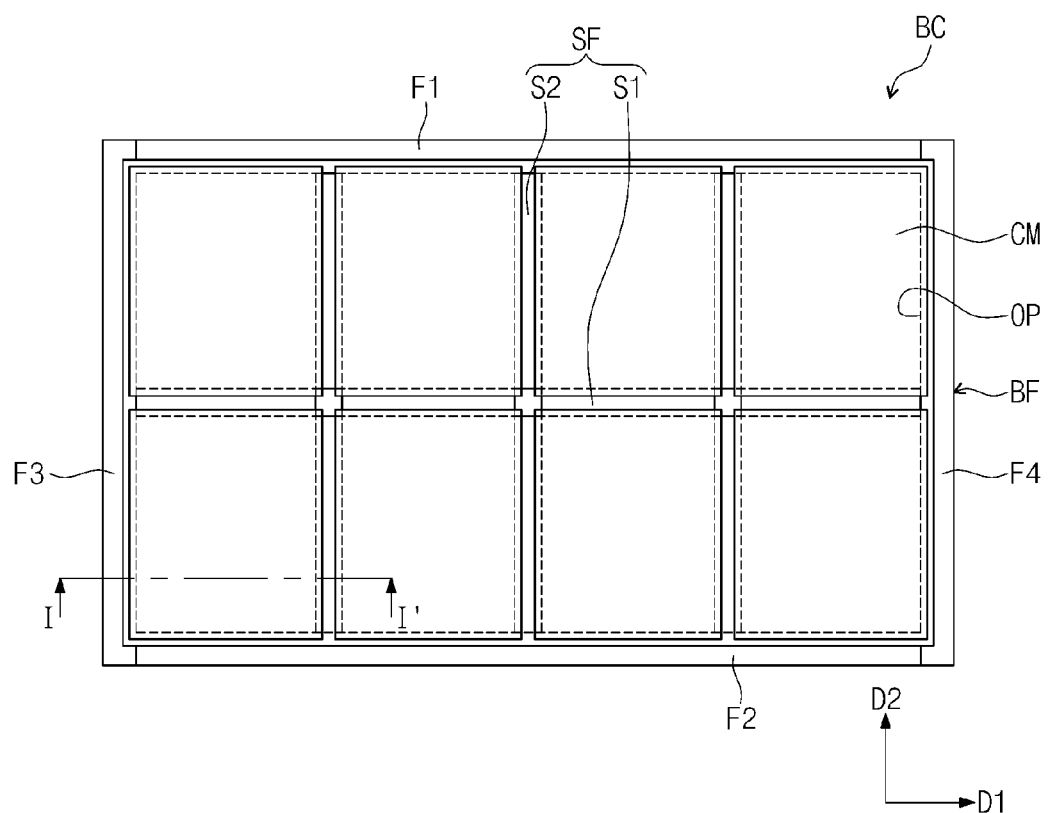
FIG. 2 is a plan view illustrating the bottom cover of FIG. 1.

FIG. 2 is a plan view illustrating the bottom cover of FIG. 1.

Figure 3:
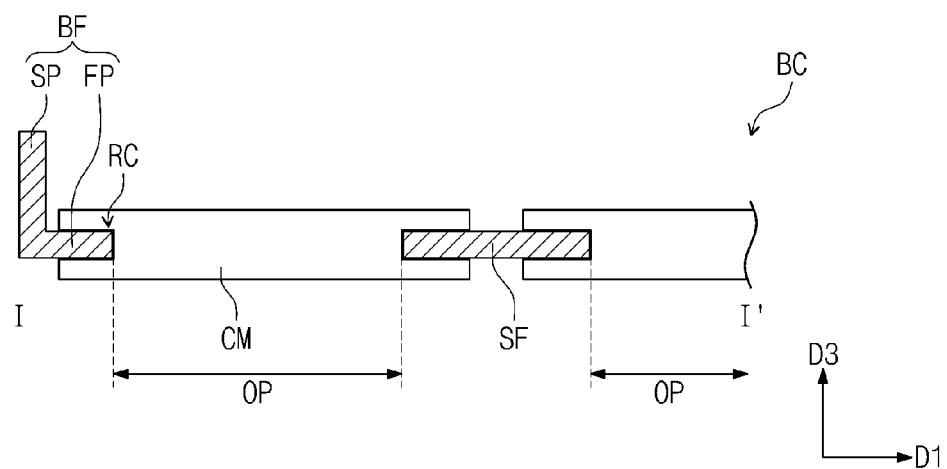
FIG. 3 is a cross sectional view of the bottom cover taken along line I-I' of FIG. 2.

FIG. 3 is a cross sectional view of the bottom cover taken along line I-I' of FIG. 2.

Hereinafter, the bottom cover BC will be described in more detail with reference to FIGS. 1 through 3.

In example embodiments, the bottom cover BC may include the bottom frame BF, the supporting frame SF, and the cover member CM.

The bottom frame BF may be shaped like a rectangle, when viewed in a plan view, and it may include a plurality of frames that can be assembled or disassembled to each other.

In an exemplary embodiment, the bottom frame BF may include first to fourth frame portions F1, F2, F3, and F4, for example. The first and second frame portions F1 and F2 may extend parallel to the first direction D1 and spaced apart from each other in the second direction D2. In an exemplary embodiment, the first and second frame portions F1 and F2 may be disposed on the long sides, respectively, of the display panel PNL. The third and fourth frame portions F3 and F4 may extend parallel to the second direction D2 and spaced apart from each other in the first direction D1. In an exemplary embodiment, the third and fourth frame portions F3 and F4 may be disposed on the short sides, respectively, of the display panel PNL. Each of the first to fourth frame portions F1, F2, F3, and F4 may connect a pair of frame portions facing each other to each other.

The first to fourth frame portions F1, F2, F3, and F4 may include a lightweight material, e.g., an aluminum-containing metal, but exemplary embodiments of the invention may not be limited thereto. In an exemplary embodiment, the first to fourth frame portions F1, F2, F3, and F4 may include stainless steel, plastic, and so forth.

Each of the first and second frame portions F1 and F2 may have a curved shaped along the first direction D1, and each of the third and fourth frame portions F3 and F4 may have a curved shaped along the second direction D2.

In an exemplary embodiment, the bottom frame BF may be provided using an injection molding process, for example. In exemplary embodiments, each of the first to fourth frame portions F1, F2, F3, and F4 may be provided using an extruding process to have a curved shape. Since the first to fourth frame portions F1, F2, F3, and F4 are used for the bottom frame BF, it is possible to suppress a bent element from being distorted by a spring back effect or its restoring force. In other words, it is easy to preserve a curved shape of the bottom cover BC.

In exemplary embodiments, each of the first to fourth frame portions F1, F2, F3, and F4 may have at least one bending portion along an extending direction thereof, when viewed in a cross sectional view perpendicular to the extending direction thereof.

Referring to FIG. 3, when viewed in a cross sectional view of the bottom frame BF, the bottom frame BF may extend in the first direction D1 and include a fixing member, e.g., a fastening portion FP, which may be configured to fasten or support a portion of the backlight unit BLU. Further, the bottom frame BF may include a sidewall portion SP extending from the fastening portion FP toward the third direction D3 and thereby having a bending profile. In the bottom cover BC, the sidewall portion SP makes it possible to include the backlight unit BLU stably.

Referring back to FIGS. 1 and 2, the supporting frame SF may be provided in the opening OP defined by the rectangular bottom frame BF to maintain a shape of the bottom cover BC. In exemplary embodiments, the supporting frame SF may be configured to fasten and support at least a portion of the backlight unit BLU to be included in the bottom cover BC.

The supporting frame SF may connect at least two of the first to fourth frame portions F1, F2, F3, and F4 to each other. In exemplary embodiments, the supporting frame SF may include at least one first sub-frame S1, which may be provided between the first and second frame portions F3 and F4 to extend parallel to the first direction D1, and at least one second sub-frame S2, which may be provided between the third and fourth frame portions F1 and F2 to extend parallel to the second direction D2.

In an exemplary embodiment, the number of each of the first and second sub-frames S1 and S2 may be two or more. The first sub-frames S1 may be spaced apart from, by a specific space, and parallel to each other, and the second sub-frames S2 may be disposed spaced apart from, by a specific space, and parallel to each other.

The supporting frame SF may include a lightweight material, e.g., an aluminum-containing metal, but the invention may not be limited thereto. In an exemplary embodiment, the supporting frame SF may include stainless steel, plastic, and so forth.

Each of the first and second sub-frames S1 and S2 may have a curved shape in an extending direction thereof.

In exemplary embodiments, numbers of the first and second sub-frames S1 and S2 may be variously modified to be different from those of FIG. 3. Further, in FIG. 3, the first sub-frame S1 is illustrated to be perpendicular to the second sub-frame S2, but the invention may not be limited thereto. In an exemplary embodiment, the first sub-frame S1 and the second sub-frame S2 may extend to be at a predetermined angle with reference to the first or second direction D1 or D2, and an angle between the first and second sub-frames S1 and S2 may have any values.

The supporting frame SF may be disposed in the opening OP defined by the bottom frame BF, but the invention may not be limited thereto. In an exemplary embodiment, the supporting frame SF may be provided outside the bottom frame BF to maintain shapes of the bottom cover BC and the bottom frame BF.

The cover member CM may cover the openings OP defined by the bottom frame BF and the supporting frame SF and thereby preventing a foreign body from being provided into the display apparatus 100.

The cover member CM is provided in a plural number, each of which is provided to cover a corresponding one of the openings OP. In exemplary embodiments, the cover member CM may have a rectangular shape, when viewed in a plan view. However, the shape of the cover member CM may not be limited to the example of rectangle and may be modified depending on the shape of the opening OP. In an exemplary embodiment, the cover member CM may have a triangular or circular shape.

Referring back to FIG. 3, when viewed in a cross sectional view of the cover member CM, a recess RC may be defined in the cover member CM, in which the bottom frame BF or the supporting frame SF can be inserted. The recess RC may be defined at a position corresponding to the bottom frame BF or the supporting frame SF. In an exemplary embodiment, the recess RC may be defined along a side circumference of the cover member CM.

Near the fastening portion FP of the bottom frame BF, the recess RC may be defined to have a hollow shape that is fittingly engaged with a shape of the fastening portion FP, and thus, the fastening portion FP can be partially inserted into the recess RC. Further, near the supporting frame SF, the recess RC may be defined to have a hollow shape that is fittingly engaged with the shape of the supporting frame SF, and thus, the supporting frame SF can be partially inserted into the recess RC.

The recess RC may be defined with various shapes depending on the shape of the bottom frame BF or the supporting frame SF. In an exemplary embodiment, as long as the bottom frame BF or the supporting frame SF can be inserted into the recess RC to cover the openings OP, the shape of the recess RC may be defined with any shapes.

Further, although not shown, in the state of each of the cover members CM is provided to be spaced apart from each other in each of the openings OP, the cover members CM, which are positioned in an internal region of the bottom cover BC, may be connected to each other and thereby be provided in the provided of a single film.

The cover member CM may include a flexible material. In an exemplary embodiment, the flexible material may be a silicone resin, for example. Accordingly, in a process of fabricating the bottom cover BC, it is easy to insert the cover member CM into the openings OP. Further, since the cover member CM includes a lightweight material, e.g., silicone resin, it is possible to effectively reduce a weight of the bottom cover BC.

As described above, since the bottom frame BF having a reduced weight is used for the bottom cover BC, it is possible to effectively reduce a weight of the display apparatus 100.

Since the bottom cover BC is fabricated by connecting the bottom and supporting frames BF and SF having the curved shapes, it is possible to consistently maintain the curvatures of the bottom cover BC and the display apparatus 100.

Figure 4:
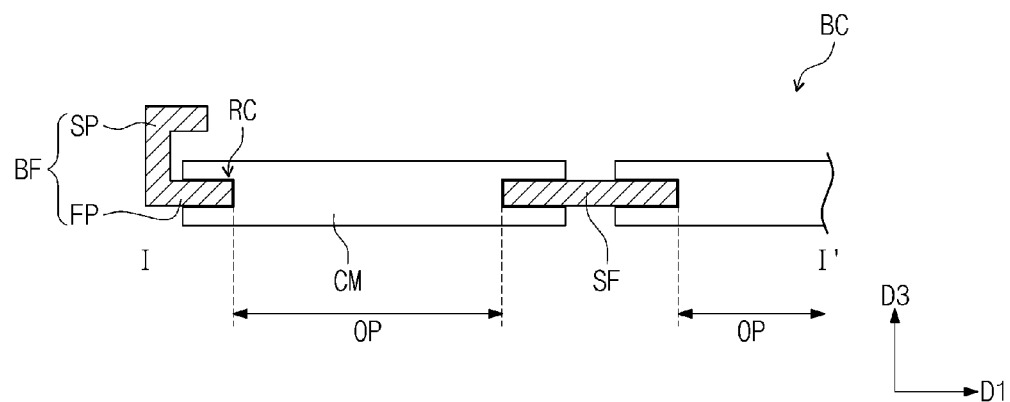
FIGS. 4 and 5 are sectional views illustrating other exemplary embodiments of bottom covers according to the invention.

FIG. 4 is a cross sectional view illustrating a bottom cover according to another exemplary embodiments of the invention.

For concise description, a previously described element may be identified by a similar or identical reference number without repeating an overlapping description thereof.

When viewed in a cross sectional view of the bottom frame BF, the bottom frame BF may extend in the first direction D1 and include a fixing member, e.g., a fastening portion FP, which may be configured to fasten or support a portion of the backlight unit BLU. Further, the bottom frame BF may include the sidewall portion SP extending from the fastening portion FP toward the third direction D3 and thereby having a bending profile. According to the illustrated exemplary embodiments, the sidewall portion SP may further include a portion extending toward the first direction D1.

As described above, the sidewall portion SP may be shaped to have one or more bending portion along an extending direction thereof, and as long as the backlight unit BLU can be included in or supported by the sidewall portion SP, the shape of the sidewall portion SP may have any shapes.

Figure 5:
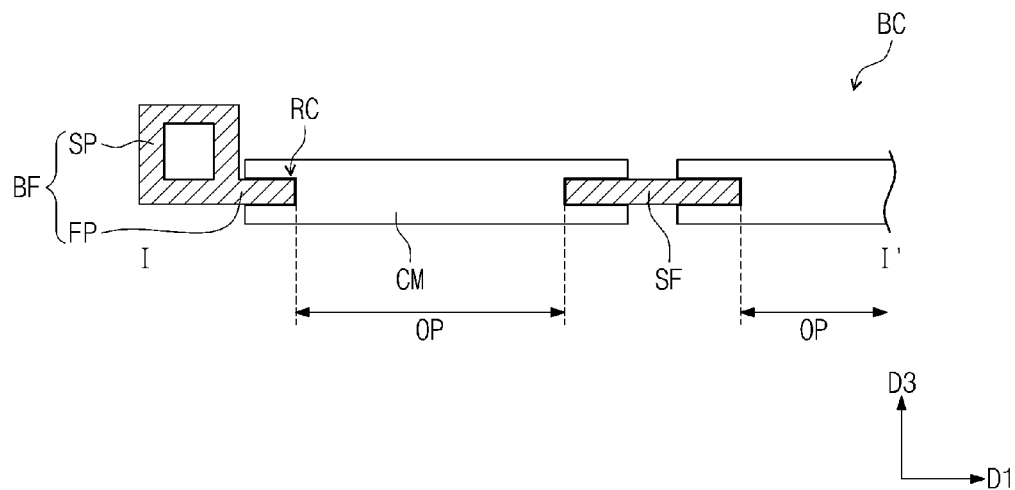

FIG. 5 is a cross sectional view illustrating a bottom cover according to still other exemplary embodiments of the invention.

For concise description, a previously described element may be identified by a similar or identical reference number without repeating an overlapping description thereof.

When viewed in a cross sectional view of the bottom frame BF, the bottom frame BF may extend in the first direction D1 and include a fixing member, e.g., a fastening portion FP, which may be configured to fasten or support a portion of the backlight unit BLU. In an exemplary embodiment, the bottom frame BF may include a sidewall portion SP that is connected to the fastening portion FP and is shaped like a polygonal ring, for example. Here, the sidewall portion SP may be configured to include at least a portion of the backlight unit BLU.

As described above, in the cases of the bottom frame BF has the ring-shaped portion, it is possible to effectively reduce weights of the bottom cover BC compared to those of the conventional bottom cover including bottom frames in which no opening is defined.

However, the sectional shape of the bottom frame BF may not be limited to the ring-like shape, and when necessary, the bottom frame BF may be configured to have a solid polygonal shape, for example.

Figure 6:
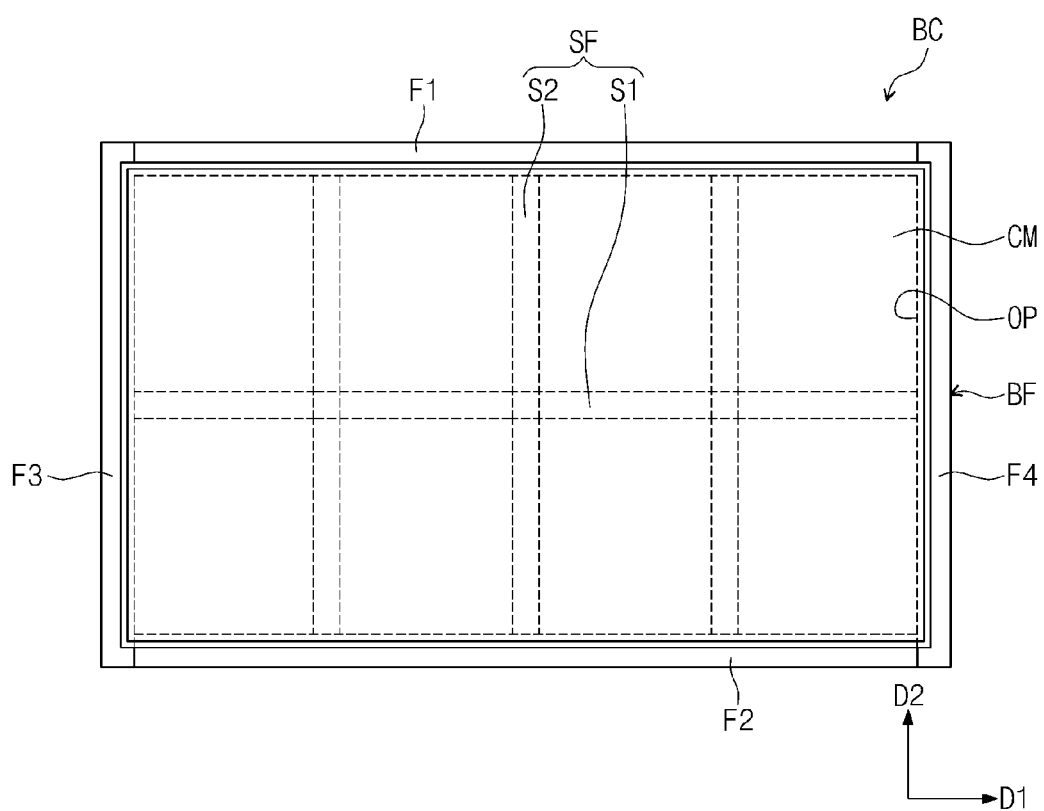
FIGS. 6 and 7 are plan views illustrating other exemplary embodiments of bottom covers according to the invention.

FIG. 6 is a plan view illustrating a bottom cover according to other exemplary embodiments of the invention.

For concise description, a previously described element may be identified by a similar or identical reference number without repeating an overlapping description thereof.

Referring to FIG. 6, the cover member CM may cover the openings OP defined by the bottom frame BF and the supporting frame SF and thereby preventing a foreign body from being provided into the display apparatus 100.

In an exemplary embodiment, the cover member CM may include a thin plate covering all of the openings OP. In other embodiments, when viewed in a plan view, the shape of the cover member CM may be shaped like a rectangle, but the invention may not be limited thereto. In an exemplary embodiment, the cover member CM may have a shape depending on the shape of the bottom frame BF.

The cover member CM may include a lightweight material, e.g., an aluminum-containing metal, but exemplary embodiments of the invention may not be limited thereto. In an exemplary embodiment, the cover member CM may include stainless steel, plastic, and so forth. Further, the cover member CM may include a flexible material and, for example, include a silicone resin film.

The cover member CM may have a curved shape. In an exemplary embodiment, a curvature of the cover member CM may be substantially the same as that of the bottom frame BF or the supporting frame SF. The cover member CM may be fastened and supported by the bottom frame BF and the supporting frame SF.

Although not shown, in an exemplary embodiment, the bottom frame BF or the supporting frame SF may include an adhesive member (not shown), which may be used to attach the cover member CM to the bottom cover BC.

Figure 7:
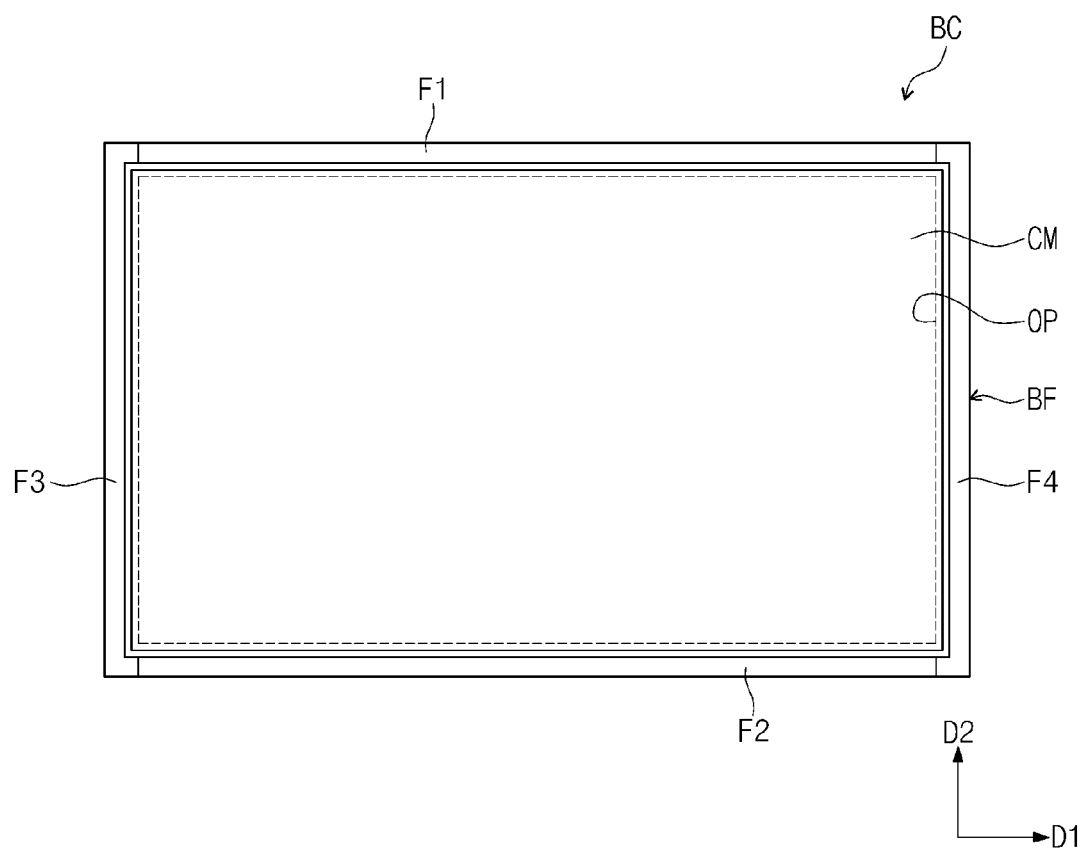

FIG. 7 is a plan view illustrating a bottom cover according to still other exemplary embodiments of the invention.

For concise description, a previously described element may be identified by a similar or identical reference number without repeating an overlapping description thereof.

Referring to FIG. 7, the bottom cover BC may include the bottom frame BF and the cover member CM.

The bottom frame BF may be shaped like a rectangle, when viewed in a plan view, and it may include a plurality of frames that can be assembled or disassembled to each other.

The cover member CM may cover the opening OP defined by the bottom frame BF and thereby preventing a foreign body from being provided into the display apparatus 100.

In an exemplary embodiment, the cover member CM may include a thin plate covering wholly the opening OP. In other embodiments, the cover member CM may have a rectangular shape, when viewed in a plan view, but exemplary embodiments of the invention may not be limited thereto. In an exemplary embodiment, the shape of the cover member CM may be changed depending on the shape of the bottom frame BF.

The cover member CM may include a lightweight material, e.g., an aluminum-containing metal, but exemplary embodiments of the invention may not be limited thereto. In an exemplary embodiment, the cover member CM may include stainless steel, plastic, and so forth. Further, the cover member CM may include a flexible material and, for example, include a silicone resin film.

The cover member CM may have a curved shape. In an exemplary embodiment, a curvature of the cover member CM may be substantially the same as that of the bottom frame BF. The cover member CM may be fastened and supported by the bottom frame BF.

Although not shown, in an exemplary embodiment, the bottom frame BF may include an adhesive member (not shown), which may be used to attach the cover member CM to the bottom cover BC.

Exemplary embodiments of the invention provide a display apparatus, in which curvature can be stably preserved.

Exemplary embodiments of the invention provide a lightweight display apparatus.

Exemplary embodiments of the invention provide a display apparatus configured to provide a high quality image.

While exemplary embodiments of the invention have been particularly shown and described, it will be understood by one of ordinary skill in the art that variations in form and detail may be made therein without departing from the spirit and scope of the attached claims.

What is claimed is:
1. A display apparatus, comprising:
a curved display panel which displays an image;
a bottom frame which is disposed below the curved display panel and curved along the curved display panel, and the bottom frame having an opening which is defined in the bottom frame and overlapped with the display panel in a plan view; and a cover member covering the opening, wherein an end portion of the bottom frame is inserted in a recess defined in a side of the cover member, extending along a circumference side of the cover member and facing the bottom frame, the recess comprises a plurality of inner surfaces including a first inner surface which is perpendicular to a length extension direction of the cover member, and second and third inner surfaces which are perpendicular to the first inner surface and face each other, and at least two of the first to third inner surfaces contact the end portion of the bottom frame.

2. The display apparatus of claim 1, wherein the display panel includes a curved profile in at least one of first and second directions crossing each other.

3. The display apparatus of claim 2, wherein the display panel has a rectangular shape, of which long sides are curved along the first direction and short sides are curved along the second direction.

4. The display apparatus of claim 3, wherein the first direction is substantially perpendicular to the second direction.

5. The display apparatus of claim 2, wherein the bottom frame comprises first and second frame portions, which are curved along the first direction and spaced apart from each other in the second direction, and third and fourth frame portions, which are curved along the second direction and are spaced apart from each other in the first direction.

6. The display apparatus of claim 5, wherein the bottom frame includes aluminum.

7. The display apparatus of claim 6, wherein each of the first to fourth frame portions has at least one bending portion, in a cross sectional view taken along a direction perpendicular to an extending direction thereof.

8. The display apparatus of claim 6, wherein each of the first to fourth frame portions has a polygonal shape, in a cross sectional view taken along a direction perpendicular to an extending direction thereof.

9. The display apparatus of claim 6, wherein each of the first to fourth frame portions has a polygonal ring shape, in a cross sectional view taken along a direction perpendicular to an extending direction thereof.

10. The display apparatus of claim 6, wherein the bottom frame further comprises a supporting frame connecting at least two of the first to fourth frame portions to each other.

11. The display apparatus of claim 10, wherein the supporting frame is curved along the second direction and is connected to the first and second frame portions.

12. The display apparatus of claim 10, wherein the supporting frame is curved along the first direction and is connected to the third and fourth frame portions.

13. The display apparatus of claim 10, wherein the supporting frame includes aluminum.

14. The display apparatus of claim 10, wherein the supporting frame is provided in a plural number and supporting frames define a plurality of openings.

15. The display apparatus of claim 14, wherein the cover member is provided in a plural number and each of cover members is provided in a corresponding one of the openings.

16. The display apparatus of claim 15, wherein each of the cover members has a shape according to a shape of a corresponding one of the openings.

17. The display apparatus of claim 1, wherein the cover member includes a silicone resin.

18. The display apparatus of claim 1, wherein the cover member includes aluminum plate covering the opening.

* * * * *